US006717466B2

(12) United States Patent
Reithmaier et al.

(10) Patent No.: US 6,717,466 B2
(45) Date of Patent: Apr. 6, 2004

(54) COMPARATOR

(75) Inventors: Stefan Reithmaier, Freising (DE); Laszio Goetz, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/304,569

(22) Filed: Nov. 26, 2002

(65) Prior Publication Data

US 2003/0164733 A1 Sep. 4, 2003

(30) Foreign Application Priority Data

Nov. 26, 2001 (DE) .......................... 101 57 962

(51) Int. Cl.[7] .............................................. H03F 3/45
(52) U.S. Cl. ........................................ 330/252; 330/257
(58) Field of Search ................................ 330/252, 257, 330/288; 327/359; 323/315, 316

(56) References Cited

U.S. PATENT DOCUMENTS 4,893,090 A * 1/1990 Boudewijns ................ 330/253
5,789,980 A * 8/1998 Nagata et al. ............... 330/253
6,605,995 B2 * 8/2003 Toda ........................... 330/252

* cited by examiner

*Primary Examiner*—Henry Choe
(74) *Attorney, Agent, or Firm*—Frederick J. Telecky, Jr.; W. James Brady III

(57) ABSTRACT

A comparator includes a differential amplifier stage comprising two emitter-interconnected bipolar transistors whose bases form the two inputs of the comparator, a first load element connected to the collector of the first bipolar transistor and a second load element connected to the collector of the second bipolar transistor. The comparator also includes a first MOSFET and a second MOSFET, a circuit point at which the drop in voltage across the first load element in operation of the differential amplifier stage occurs is connected to the source of the first MOSFET and the backgate of the second MOSFET, the circuit point at which the drop in voltage across the second load element in operation of the differential amplifier stage being connected to the source of the second MOSFET and the backgate of the first MOSFET, and the drain of the second MOSFET forming the output of the comparator. The comparator, in addition to providing the low offset voltage of a differential amplifier stage comprising bipolar transistors, also features a low current consumption and very fast response.

5 Claims, 1 Drawing Sheet

COMPARATOR

FIELD OF THE INVENTION

The invention relates generally to comparators and, more particularly, to a comparator comprising a differential amplifier stage comprising two emitter-interconnected bipolar transistors whose bases form the two inputs of the comparator, a first load element connected to the collector of the first bipolar transistor and a second load element connected to the collector of the second bipolar transistor.

BACKGROUND OF THE INVENTION

Comparators based on differential amplifiers including bipolar transistors have a wealth of applications. In some applications it is important that the switching time of the comparator does not exceed a critical value so as not to sacrifice the advantages of the bipolar transistor, namely the low offset voltage of the differential amplifier stage and high gain.

SUMMARY OF THE INVENTION

An object of the invention is to configure a comparator of the aforementioned kind so that it features a particularly fast response.

This is achieved for a comparator of the aforementioned kind in that the comparator comprises in addition a first MOSFET and a second MOSFET, a circuit point at which the drop in voltage across the first load element in operation of the differential amplifier stage occurs is connected to the source of the first MOSFET and the backgate of the second MOSFET, the circuit point at which the drop in voltage across the second load element in operation of the differential amplifier stage being connected to the source of the second MOSFET and the backgate of the first MOSFET, and the drain of the second MOSFET forming the output of the comparator.

The comparator in accordance with the invention achieves a very fast response in that the output signal of the differential amplifier configured with high-gain bipolar transistors is used to control a MOSFET at the output which is activated by this signal both via the gate and the backgate, i.e. the substrate of the MOSFET. By employing MOSFETs at the output in conjunction with the backgate activation as described a very low current consumption of the comparator is also achieved.

BRIEF DESCRIPTION OF THE DRAWINGS

Further advantages and features of the comparator in accordance with the invention are detailed in the following description of a preferred example embodiment with reference to the drawing in which.

DETAILED DESCRIPTION OF THE INVENTION

Figure 1:
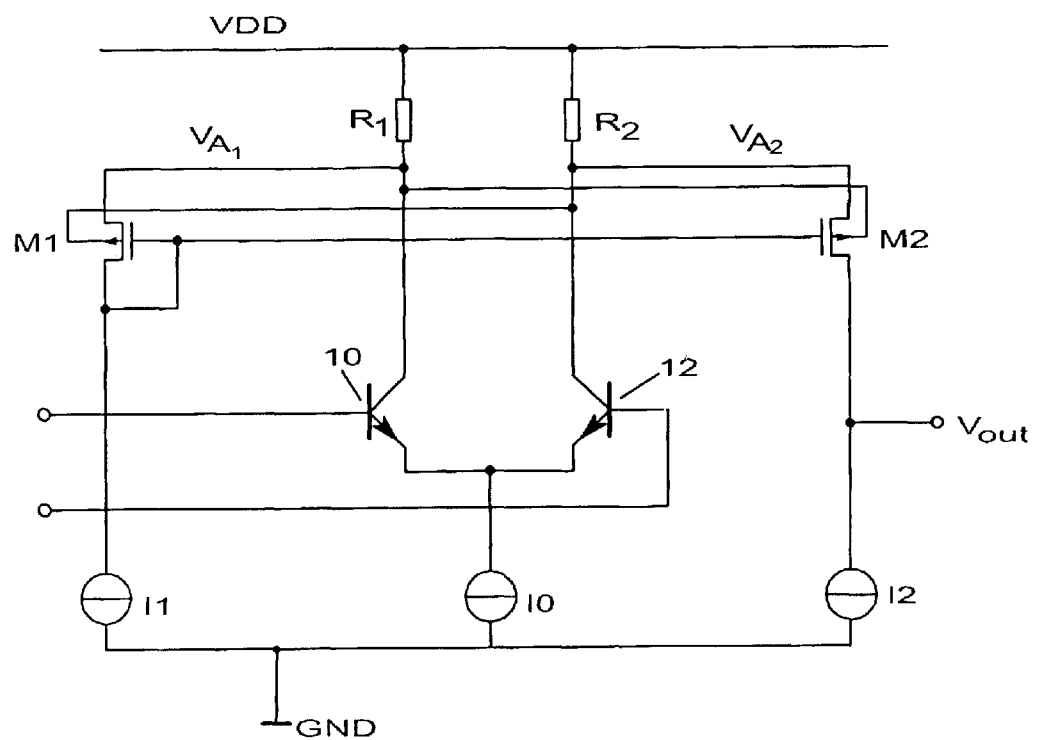
FIG. 1 is a circuit diagram of a preferred embodiment of the comparator in accordance with the invention.

The comparator in accordance with the invention, fabricated preferably integrated, comprises firstly a conventional differential amplifier stage comprising two identical emitter-interconnected bipolar transistors 10 and 12 whose bases are connected to the two inputs of the comparator. The two bipolar transistors 10 and 12 are supplied via a common constant current source IO (=third constant current source) located between the interconnection of the two emitters of the bipolar transistors and ground (GND). Instead of the constant current source IO a resistor may also be used.

The differential amplifier stage of the comparator comprises furthermore a first resistor R1 located between the supply voltage VDD and collector of the first bipolar transistor 10 and a second resistor R2 identical to the first resistor and located between the supply voltage VDD and collector of the second bipolar transistor 12. Instead of the two resistors, active load elements such as current sources and current mirrors may be used, as is known in prior art.

In addition, the comparator in accordance with the invention comprises a first MOSFET M1 which is a P-MOSFET whose source is connected to the collector of the first bipolar transistor 10 and whose drain is connected to a first constant current source I1 located at ground GND.

The comparator in accordance with the invention comprises in addition a second P-MOSFET M2 identical to the first MOSFET M1 whose source is connected to the collector of the second bipolar transistor 12 and whose drain is connected to a second constant current source I2 located at ground (GND) and furnishing the same current as the first constant current source I1.

The gates of the two MOSFETs M1 and M2 are connected to each other, the gate of the first MOSFET being connected to the first constant current source so that the gates of the two MOSFETs have the same potential.

The circuit point (collector of the first bipolar transistor 10) at which the drop in voltage VA1 occurs across the first load element R1 in operation of the differential amplifier stage is connected to the source of the first MOSFET M1 and the backgate (=substrate) of the second MOSFET M2.

The circuit point (collector of the second bipolar transistor 12) at which the drop in voltage VA2 occurs across the second load element R2 in operation of the differential amplifier stage is connected to the source of the second MOSFET M2 and the backgate (=substrate) of the first MOSFET M1.

The drain of the second MOSFET M2 is connected to the output of the comparator at which a voltage Vout occurs.

The function of the comparator in accordance with the invention will now be detailed.

As soon as e.g. a voltage V1 applied to the base of the first bipolar transistor 10 at the inputs of the comparator exceeds a voltage V2 applied to the base of the second bipolar transistor 12 (assumed=0 V) to which the voltage V1 is to be compared, the drop in voltage VA1 across the resistor R1 falls and the drop in voltage VA2 across the resistor R2 rises.

The voltage VA2 rising across the resistor R2 is applied to the source of the MOSFET M2 so that its gate/source voltage becomes more negative and the MOSFET is gradually turned on. This effect is further boosted and accelerated by the fact that the MOSFET M2 is additionally controlled via its backgate to which the drop in voltage VA1 is applied so that the substrate/source voltage of the MOSFET M2 changes, resulting in MOSFET M2 being turned on accelerated.

Turning on of MOSFET M2 causes the voltage Vout at the output of the comparator to rise and an output signal is generated which indicates that the voltage V1 applied to the base of the first bipolar transistor 10 has increased beyond the voltage V2 applied to the base of the second bipolar transistor 12.

Should the voltage V1 applied to the base of the first bipolar transistor 10 drop below the voltage V2 applied to the base of the second bipolar transistor 12, the procedure is reversed and the comparator outputs in this case another output signal.

The symmetrical configuration of the comparator guarantees the circuit being practically independent of changes in temperature.

What is claimed is:

1. A comparator including a differential amplifier stage comprising:

first and second bipolar transistors having emitters that are interconnected and bases that form two inputs of the comparator;

a first load element connected to a collector of said first bipolar transistor;

a second load element connected to a collector of said second bipolar transistor;

a first MOSFET;

a second MOSFET;

a circuit point at which a drop in voltage occurs across said first load element in operation of the differential amplifier stage being connected to a source of said first MOSFET and a backgate of said second MOSFET;

a circuit point at which a drop in voltage occurs across said second load element in operation of the differential amplifier stage being connected to a source of said second MOSFET and a backgate of said first MOSFET;

a drain of said second MOSFET forming an output of the comparator.

2. The comparator as set forth in claim 1 wherein a first constant current source is connected to a drain of said first MOSFET, and a second constant current source is connected to the drain of said second MOSFET, said second constant current source furnishing the same current as said first constant current source.

3. The comparator as set forth in claim 2 wherein said first and second MOSFETs have gates that are connected to each other and the gate of said first MOSFET is connected to said first constant current source.

4. The comparator as set forth in claim 3 wherein said bipolar transistors are supplied from a common third constant current source.

5. The comparator as set forth in claim 1 wherein said load elements comprise resistors.

* * * * *

UNITED STATES PATENT AND TRADEMARK OFFICE
CERTIFICATE OF CORRECTION

PATENT NO. : 6,717,466 B2
DATED : April 6, 2004
INVENTOR(S) : Reithmaier et al.

It is certified that error appears in the above-identified patent and that said Letters Patent is hereby corrected as shown below:

<u>Title page,</u>
Item [75], Inventors, change "Laszio" to -- Laszlo --.

Signed and Sealed this

Thirtieth Day of November, 2004

JON W. DUDAS
*Director of the United States Patent and Trademark Office*